United States Patent
Li et al.

(10) Patent No.: US 10,859,656 B2
(45) Date of Patent: Dec. 8, 2020

(54) METHODS AND SYSTEMS FOR CHEMICAL EXCHANGE SATURATION TRANSFER SIGNAL MATCHING

(71) Applicant: Cedars-Sinai Medical Center, Los Angeles, CA (US)

(72) Inventors: Debiao Li, South Pasadena, CA (US); Zhengwei Zhou, Los Angeles, CA (US)

(73) Assignee: Cedars-Sinai Medical Center, Los Angeles, CA (US)

( * ) Notice: Subject to any disclaimer, the term of this patent is extended or adjusted under 35 U.S.C. 154(b) by 270 days.

(21) Appl. No.: 15/960,225

(22) Filed: Apr. 23, 2018

(65) Prior Publication Data

US 2019/0324104 A1 Oct. 24, 2019

(51) Int. Cl.
  *G01N 24/08* (2006.01)
  *G01R 33/56* (2006.01)
  *G01R 33/483* (2006.01)

(52) U.S. Cl.
  CPC .......... *G01R 33/5605* (2013.01); *G01N 24/08* (2013.01); *G01R 33/4838* (2013.01)

(58) Field of Classification Search
  CPC . G01R 33/5605; G01R 33/4838; G01N 24/08
  See application file for complete search history.

(56) References Cited

U.S. PATENT DOCUMENTS

| | | | |
|---|---|---|---|
| 2003/0160610 A1* | 8/2003 | Van Zijl | G01R 33/4833 324/300 |
| 2008/0200799 A1* | 8/2008 | Willard | G01R 33/5601 600/420 |
| 2011/0177009 A1* | 7/2011 | Langereis | A61K 49/08 424/9.363 |

(Continued)

OTHER PUBLICATIONS

Apprich, S. et al., "Detection of degenerative cartilage disease: comparison of high-resolution morphological MR and quantitative T2 mapping at 3.0 Tesla," Osteoarthritis and Cartilage 18 (2010) 1211-1217.

(Continued)

*Primary Examiner* — Brian J. Sines
(74) *Attorney, Agent, or Firm* — Linda B. Huber; Nixon Peabody LLP

(57) ABSTRACT

A method of determining an exchange rate between a solute material and a solvent material in chemical exchange with each other in a sample comprises performing a plurality of CEST scans on the sample to determine a reference data signal and a label data signal; simulating a plurality of CEST scans on the sample to obtain a reference dictionary signal and a plurality of label dictionary signals, each label dictionary signal corresponding to a candidate exchange rate; correcting the reference dictionary signal and each label dictionary signal for a magnetization transfer effect; determining a final data signal based on the reference data signal and the label data signal; determining a plurality of final dictionary signals based on the reference dictionary signal and the plurality of label dictionary signals; and determining the exchange rate by matching the final data signal to one of the plurality of final dictionary signals.

20 Claims, 10 Drawing Sheets

(56) References Cited

U.S. PATENT DOCUMENTS

| | | | | |
|---|---|---|---|---|
| 2012/0019245 | A1* | 1/2012 | Reddy | G01R 33/5605 324/309 |
| 2012/0271159 | A1* | 10/2012 | Song | G01R 33/5601 600/420 |
| 2012/0286781 | A1* | 11/2012 | van Zijl | G01R 33/5601 324/309 |
| 2013/0166226 | A1* | 6/2013 | Lee | G01N 23/02 702/30 |
| 2013/0190601 | A1* | 7/2013 | Alsop | G01R 33/5605 600/410 |
| 2014/0070803 | A1* | 3/2014 | Jin | G01R 33/5605 324/309 |
| 2014/0167754 | A1* | 6/2014 | Jerecic | G01R 33/56 324/309 |
| 2014/0213887 | A1* | 7/2014 | Reddy | G01R 33/5605 600/414 |
| 2015/0051474 | A1* | 2/2015 | Eggers | G01R 33/5605 600/410 |
| 2015/0301141 | A1* | 10/2015 | Griswold | G01R 33/5608 382/131 |
| 2015/0323632 | A1* | 11/2015 | Sun | G01R 33/5601 324/309 |
| 2016/0025835 | A1* | 1/2016 | Gulani | A61B 5/0035 600/420 |
| 2016/0081578 | A1* | 3/2016 | Gazit | A61B 5/4824 600/410 |
| 2016/0116559 | A1* | 4/2016 | Cohen | G01R 33/5614 324/309 |
| 2016/0139228 | A1* | 5/2016 | McMahon | A61B 5/0042 324/309 |
| 2016/0187445 | A1* | 6/2016 | McMahon | G01R 33/5616 600/420 |
| 2016/0349339 | A1* | 12/2016 | Brady-Kalnay | G01R 33/5614 |
| 2016/0356870 | A1* | 12/2016 | Sun | G01R 33/5605 |
| 2017/0023658 | A1* | 1/2017 | Sun | A61B 5/055 |
| 2017/0227619 | A1* | 8/2017 | Reddy | A61B 5/4848 |
| 2017/0293005 | A1* | 10/2017 | Panther | G01R 33/445 |
| 2017/0315193 | A1* | 11/2017 | Amthor | A61B 5/055 |
| 2018/0210050 | A1* | 7/2018 | Rosen | G01R 33/5605 |
| 2018/0217220 | A1* | 8/2018 | Gulani | G01R 33/50 |
| 2018/0237741 | A1* | 8/2018 | Gazit | C12N 5/0075 |
| 2018/0313925 | A1* | 11/2018 | Parker | G01R 33/56 |
| 2019/0033412 | A1* | 1/2019 | Alsop | G01R 33/5608 |
| 2019/0346523 | A1* | 11/2019 | Li | G01R 33/5608 |

OTHER PUBLICATIONS

Chen, L. et al., "Evaluations of Extracellular pH within In Vivo Tumors Using acidoCEST MRI," Magnetic Resonance in Medicine 72:1408-1417 (2014).

Chen, L. et al., "Evaluations of Tumor Acidosis Within In Vivo Tumor Models Using Parametric Maps Generated with AcidoCEST MRI," Mol Imaging Biol (2015) 17:488-496 DOI: 10.1007/s11307-014-0816-2, World Molecular Imaging Society, 2015, (Jan. 27, 2015).

Dixon, W. et al., "A Concentration-Independent Method to Measure Exchange Rates in PARACEST Agents," Magnetic Resonance in Medicine 63:625-632 (2010).

Geades, N. et al., "Quantitative Analysis of the Z-Spectrum Using a Numerically Simulated Look-up Table: Application to the Healthy Human Brain at 7T," Magnetic Resonance in Medicine 78:645-655 (2017).

Gibbs, P. et al., "Comparison of Quantitative $T_2$ Mapping and Diffusion-Weighted Imaging in the Normal and Pathologic Prostate," Magnetic Resonance in Medicine 46:1054-1058 (2001).

Goerke, S. et al., Characterization of creatine guanidinium proton exchange by water-exchange (WEX) spectroscopy for absolute-pH CEST imaging in vitro, (wileyonlinelibrary.com) DOI: 10/1002/nbm.3086 (Feb. 17, 2014).

Hamilton, J. et al., "MR Fingerprinting for Rapid Quantification of Myocardial $T_1$ $T_2$, and Proton Spin Density," Magnetic Resonance in Medicine 77:1446-1458 (2017).

Hans, M. et al., "A technique for in vivo mapping of myocardial creatine kinase metabolism," Nature Medicine, Technical Reports, doi:10.1038/nm.3436 (Jan. 12, 2014).

Henkelman, R. et al., "Quantitative Interpretation of Magnetization Transfer," MRM 29:759-766 (1993) From the Sunnybrook Health Science Centre and Departments of Medical Biophysics and Radiology, University of Toronto (Jan. 4, 1993).

Heo, H-Young. et al., "Quantitative Assessment of Amide Proton Transfer (APT) and Nuclear Overhauser Enhancement (NOE) Imaging with Extrapolated Semisolid Magnetization Transfer Reference (EMR) Signals: II. Comparison of Three EMR Models and Application to Human Brain Glioma at 3 Tesla," Magnetic Resonance in Medicine 75:1630-1639 (2016).

Heo, H-Young. et al., "Quantitative Assessment of Amide Proton Transfer (APT) and Nuclear Overhauser Enhancement (NOE) Imaging with Extrapolated Semisolid Magnetization Transfer Reference (EMR) Signals: Application to a Rat Glioma Model at 4.7 Tesla," Magnetic Resonance in Medicine 75:137-149 (2016).

Huang, S. et al., Quantitative Chemical Exchange Saturation Transfer (CEST) Imaging with Magnetic Resonance Fingerprinting (MRF), Proc. Intl. Soc. Mag. Reson. Med. 25 (2017).

Jin, T. et al., Spin-Locking Versus Chemical Exchange Saturation Transfer MRI for Investigating Chemical Exchange Process Between Water and Labile Metabolite Protons, Magnetic Resonance in Medicine 65:1448-1460 (2011).

Jin, T. et al., "Advantages of Chemical Exchange-Sensitive Spin-Lock (CESL) Over Saturation Transfer (CEST) for Hydroxyl- and Amine-Water Proton Exchange Studies," NMR Biomed. Nov. 2014; 27(11): 1313-1324. doi:10.1002/nbm.3191.

Liney, G. et al., "Comparison of Conventional Single Echo and Multi-Echo Sequences with a Fast Spin-Echo Sequence for Quantitative T2 Mapping: Application to the Prostate," 604.JMRI. Jul./Aug. 1996.

Longo, D. et al., "In Vivo Imaging of Tumor Metabolism and Acidosis by Combining PET and MRI-CEST pH Imaging," Integrated Systems and Technologies, DOI: 10.1158/0008-5472.CAB-16/0825 (Sep. 20, 2016).

Longo, D. et al. "A General MRI-CEST Ratiometric Approach for pH Imaging: Demonstration of in Vivo pH Mapping with lobitridol," Journal of the American Chemical Society, dx.doi.org/10.1021/ja5059313/J. Am.Chem. Soc. 2014, 136, 14333-14336.

Ma, D. et al., "Magnetic resonance fingerprinting," doi:10.1038/nature 11971, vol. 495, Nature, 187-193 (Mar. 14, 2013).

McConnell, H. "Reaction Rates by Nuclear Magnetic Resonance," The Journal of Chemical Physics; doi: 10.1063/1.1744152, vol. 28, No. 3 (Mar. 1958).

McMahon, M. et al., "Quantifying Exchange Rates in Chemical Exchange Saturation Transfer Agents Using the Saturation Time and Saturation Power Dependencies of the Magnetization Transfer Effect on the Magnetic Resonance Imaging Signal (QUEST and QUESP): pH Calibration for Poly-L-Lysine and a Starburst Dendrimer," Magnetic Resonance in Medicine 55:836-847 (2006).

Meissner, J-Eric et al., "Quantitative pulsed CEST-MRI using $\Omega$-plots," (wileyonlinelibrary.com) DOI: 10-1002/nbm.3362 (Aug. 17, 2015).

Rerich, E. et al., "Relaxation-compensated CEST-MRI at 7T for mapping of creatine content and pH—preliminary application in human muscle tissue in vivo," (wileyonlinelibrary.com) DOI: 10.1002/nbm.3367 (Sep. 16, 2015).

Sheth, V. et al., "Measuring In Vivo Tumor pHe With CEST-FISP MRI," Magnetic Resonance in Medicine 67:760-768 (2012).

Song, X. et al., CEST Phase Mapping Using a Length and Offset VARied Saturation (LOVARS) Scheme, Magnetic Resonance in Medicine 68:1074-1086 (2012).

Song, X. et al., "Multi-Echo Length and Offset VARied Saturation (MeLOVARS) Method for Improved CEST Imaging," Magnetic Resonance in Medicine 73:488-496 (2015).

Stabinska, J. et al., "Quantitative pulsed CEST-MRI at a clinical 3T MRI system," Magn Reson Mater Phy (2017) 30:505-516, DOI 10.1007/s10334-017-0625-0 (May 31, 2017).

Sun, P. et al., "Quantification of iopamidol multi-site chemical exchange properties for ratiometric chemical exchange saturation

(56) References Cited

OTHER PUBLICATIONS transfer (CEST) imaging of pH," Phys Med Biol. Aug. 21, 2014; 59(16): 4493-4504. Doi:10-1088/0031-9155/59/16/4493.

Sun, P. et al., "Early Experience of translating pH-weighted MRI to image human subjects at 3 Tesla," *Stroke*. Oct. 2010; 41 (10 Suppl): S147-S151. doi:10.1161/STROKEAHA.110.595777.

Ward, K.M. et al., Determination of pH Using Water Protons and Chemical Exchange Dependent Saturation Transfer (CEST), Magnetic Resonance in Medicine 44:799-802 (2000).

Wu, R. et al., "Quantitative chemical exchange saturation transfer (qCEST) MRI—omega plot analysis of RF-spillover-corrected inverse CEST ration asymmetry for simultaneous determination of labile proton ratio and exchange rate," (wileyonlinelibrary.com) DOI: 10.1002/nbm.3257 (Jan. 23, 2015).

Wu. R. et al., "Quantitative description of radiofrequency (RF) power based ratiometric chemical exchange saturation transfer (CEST) pH imaging," (wileyonlinelibrary.com) DOI: 10.1002/nbm.3284 (Mar. 23, 2015).

Xu, J. et al., "On the origins of chemical exchange saturation transfer (CEST) contrast in tumors at 9.4 T," (wileyonlinelibrary.com) DOI: 10.1002/nbm.3075 (Jan. 29, 2014).

Ye, H. et al., "Accelerating Magnetic Resonance Fingerprinting (MRF) Using t-Blipped Simultaneous Multislice (SMS) Acquisition," Magnetic Resonance in Medicine 75: 2078-2085 (2016).

Yuan, J. et al., "MR Chemical Exchange Imaging with Spin-Lock Technique (CESL): A Theoretical Anaylysis of Z-spectrum using a Two-Pool $R_{1\rho}$ Relaxation Model beyond the Fast-Exchange Limit," *Phys Med Biol*. Dec. 21, 2012; 57(24): 8185-8200. doi: 10.1088/0031-9155/57/24/8185.

Zaiss, M. et al., "Quantitative separation of CEST effect from magnetization transfer and spillover effects by Lorentzian-line-fit analysis of z-spectra," Journal of Magnetic Resonance 211 (2011) 149-155.

Zaiss, M. et al., "Inverse Z-spectrum analysis for spillover-, MT-, and $T_1$—corrected steady-state pulsed CEST-MRI—application to pH-weighted MRI of acute stroke," (wileyonlinelibrary.com) DOI: 10.1002/nbm.3054 (Jan. 3, 2014).

Zhang, S. et al., "Balanced Steady-State Free Precession (bSSFP) from an effective field perspective: Application to the detection of chemical exchange (bSSFPX)," Journal of Magnetic Resonance 275 (2017) 55-67.

Zhou, I. et al., "Quantitative chemical exchange saturation transfer (CEST) MRI of glioma using Image Downsampling Expedited Adaptive Least-squares (IDEAL) fitting," Scientific Reports 7:84 DOI:10.1038/s41598-017-00167-y (Mar. 7, 2017).

Zhou, J. et al., "Using the amide proton signals of intracellular proteins and peptides to detect pH effects in MRI," nature medicine, Technical Reports, vol. 9, No. 8, (Aug. 2003).

Zhou, J. et al., "Defining an Acidosis-Based Ischemic Penumbra from pH-Weighted MRI," *Transl Stroke Res*. Oct. 28, 2011; 3(1): 76-83. doi:10.1007/s12975-011-0110-4.

Zhou, Z. et al., "Quantitative Chemical Exchange Saturation Transfer MRI of Intervertebral Disc in a Porcine Model," Magnetic Resonance in Medicine 76:1677-1683 (2016).

Zu, Z. et al., "Optimizing Pulsed-Chemical in Exchange Saturation Transfer Imaging Sequences," Magnetic Resonance Medicine 66:1100-1108 (2011).

Zu, Z. et al., "Multi-Angle Ratiometric Approach to Measure Chemical Exchange in Amide Proton Transfer Imaging," Magnetic Resonance in Medicine 68:711-719 (2012).

\* cited by examiner

METHODS AND SYSTEMS FOR CHEMICAL EXCHANGE SATURATION TRANSFER SIGNAL MATCHING

TECHNICAL FIELD

The present disclosure relates to chemical exchange saturation transfer imaging, more specifically, the present disclosure relates to performing chemical exchange saturation transfer scans on a sample to determine a data signal, and matching the data signal to a dictionary of potential data signals to determine an exchange rate.

BACKGROUND

Chemical exchange saturation transfer (CEST) imaging is a type of magnetic resonance-based imaging that can be used to detect certain acidity-based conditions in the human body, such as acidosis-based ischemic penumbra and tumor acidosis. In an example, CEST imaging can create contrast between water in tissue (solvent material) and other materials or compounds in the tissue (solute material) that are of interest. CEST imaging is affected by a number of different parameters, including the exchange rate of protons between the solute material and the solvent material, which is related to the pH of the solute material. Current efforts to determine the exchange rate include performing CEST scans on tissue samples and numerically solving the equations describing the results of the performed CEST scans. The exchange rate between the solute material and the solvent material is a variable in these equations, and thus can be solved for or approximate for. However, due to the complexity of these equations however, solving can be computationally expensive. In addition, long scan times are often needed to obtain the necessary data from the tissue sample. Approximating solutions to the equations can lead to inaccurate results. Aspects of the present disclosure overcome these difficulties and address other needs.

SUMMARY

According to aspects of the present disclosure, a method of determining an exchange rate between a solute material and a solvent material in chemical exchange with each other in a sample comprises receiving data indicative of a plurality of reference CEST scans performed on the sample and a plurality of label CEST scans performed on the sample; determining a reference data signal and a label data signal based on the received data; simulating a plurality of reference CEST scans on the sample to obtain a reference dictionary signal; simulating a plurality of groups of label CEST scans on the sample to obtain a plurality of label dictionary signals, each of the plurality of label dictionary signals corresponding to a respective one of a plurality of candidate exchange rates between the solvent material and the solute material; correcting the reference dictionary signal and each of the plurality of label dictionary signals for a magnetization transfer effect between the solvent material and the solute material; determining a final data signal based on the reference data signal and the label data signal; determining a plurality of final dictionary signals based on the reference dictionary signal and the plurality of label dictionary signals; and determining the exchange rate between the solute material and the solvent material in the sample by matching the final data signal to one of the plurality of final dictionary signals.

According to other aspects of the present disclosure, a method of creating an exchange rate-weighted cross-sectional image of a sample containing a solute material and a solvent material that are in chemical exchange with each other comprises defining a cross-sectional area of the sample, the cross-sectional area containing a plurality of pixels; determining an exchange rate between the solute material and the solvent material at each of the plurality of pixels, and mapping the exchange rate of the solute material to the cross-sectional area by correlating the exchange rate at each of the plurality of pixels to a color of each of the plurality of pixels. The determining of the exchange rate at a respective pixel further comprises receiving a data signal based on a plurality of CEST scans performed on the sample; simulating a plurality of groups of CEST scans to obtain a plurality of dictionary signals, each of the plurality of dictionary signals corresponding to a respective one of a plurality of candidate exchange rates between the solute material and the solvent material; and matching the data signal to one of the plurality of dictionary signals to determine an exchange rate between the solute material and the solvent material at the respective pixel.

According to additional aspects of the present disclosure, a system for determining an exchange rate between a solute material and a solvent material in chemical exchange with each other in a sample comprises at least one processor and at least one memory containing processor-executable instructions. When the processor-executable instructions are executed by the at least one processor, the processor is caused to receive data indicative of a plurality of reference CEST scans performed on the sample and a plurality of label CEST scans performed on the sample; determine a reference data signal and a label data signal based on the received data; simulate a plurality of reference CEST scans on the sample to obtain a reference dictionary signal; simulate a plurality of groups of label CEST scans on the sample to obtain a plurality of label dictionary signals, each of the plurality of label dictionary signals corresponding to a respective one of a plurality of candidate exchange rates between the solute material and the solvent material; correct the reference dictionary signal and each of the plurality of label dictionary signals for a magnetization transfer effect between the first material and the second material; determine a final data signal based on the reference data signal and the label data signal; determine a plurality of final dictionary signals based on the reference dictionary signal and the plurality of label dictionary signals; and determine the exchange rate between the solute material and the solvent material in the sample by matching the final data signal to one of the plurality of final dictionary signals.

The foregoing and additional aspects and implementations of the present disclosure will be apparent to those of ordinary skill in the art in view of the detailed description of various embodiments and/or implementations, which is made with reference to the drawings, a brief description of which is provided next.

BRIEF DESCRIPTION OF THE DRAWINGS

The foregoing and other advantages of the present disclosure will become apparent upon reading the following detailed description and upon reference to the drawings.

Figure 1:
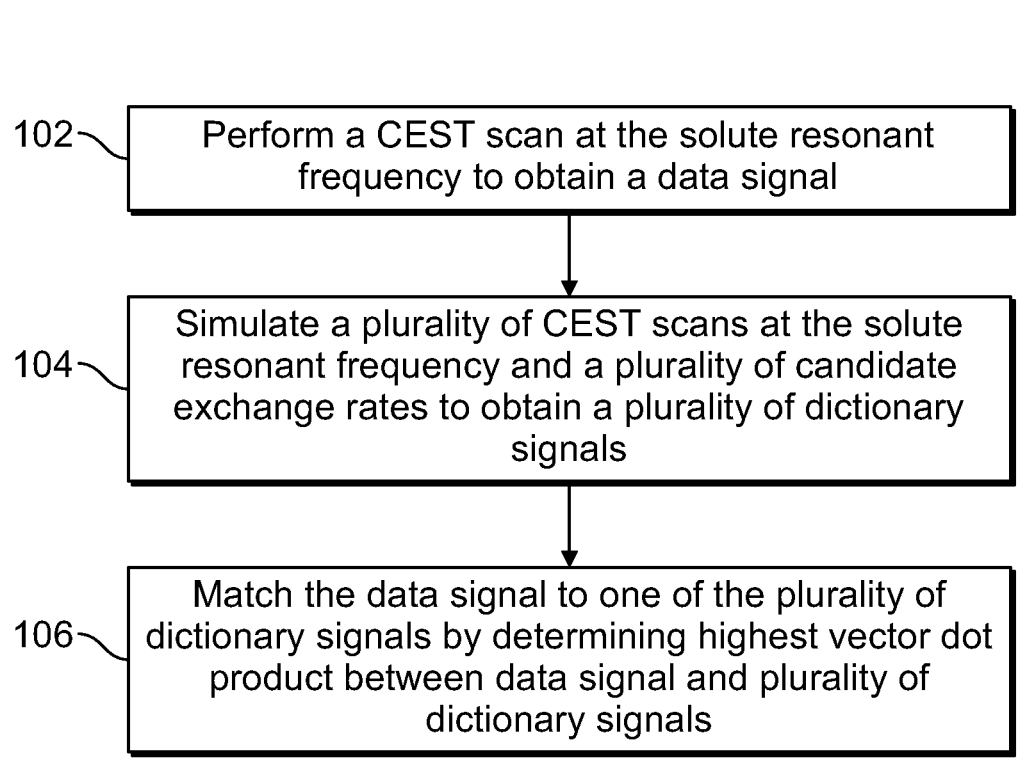
FIG. 1 is a flow chart of a method for determining an exchange rate between a solute material and a solvent material in chemical exchange with each other, according to aspects of the present disclosure.

While the present disclosure is susceptible to various modifications and alternative forms, specific implementations and embodiments have been shown by way of example in the drawings and will be described in detail herein. It should be understood, however, that the present disclosure is not intended to be limited to the particular forms disclosed. Rather, the present disclosure is to cover all modifications, equivalents, and alternatives falling within the spirit and scope of the present disclosure as defined by the appended claims.

DETAILED DESCRIPTION

While the present disclosure has been described with reference to one or more particular embodiments or implementations, those skilled in the art will recognize that many changes may be made thereto without departing from the spirit and scope of the present disclosure. Each of these embodiments or implementations and obvious variations thereof is contemplated as falling within the spirit and scope of the present disclosure. It is also contemplated that additional embodiments implementations according to aspects of the present disclosure may combine any number of features from any of the embodiments described herein.

Magnetic resonance-based imaging (MR imaging) is a technique most often used for imaging the human body that takes into account principles of nuclear magnetic resonance. For example, doctors and other medical professionals often use MR imaging to view tissue within the human body. Nuclear magnetic resonance is a phenomenon in which nuclei (such as protons in body tissue) localized in a magnetic field emit energy that can be detected. This energy that is detected can be used to create an image. MR imaging generally involves two principle steps. First, the magnetic moment of the nuclei (a vector property of a nucleus caused by the intrinsic spin property of elementary particles) are aligned (or polarized) by the presence of an external magnetic field. While in the presence of this external magnetic field, the magnetic moment of each nuclei will generally precess about an axis parallel to the magnetic field. The rate of this precession ω is generally proportional to $\gamma B_0$, where $B_0$ is the magnitude of the external magnetic field, and $\gamma$ is the gyromagnetic ratio of the nuclei, which is the ratio the nuclei's magnetic moment to its angular momentum. The rate of the precession co is considered the nuclei's resonant frequency.

The second principle step in MR imaging is to apply an electromagnetic pulse sequence (usually a radiofrequency, or RF, pulse) to the nuclei. When the frequency of the RF pulses sequence is generally equal to the resonant frequency of the nuclei, the nuclei absorb the energy of the RF pulse and the magnetic moments are rotated out of alignment with the magnetic field. The magnetic moments of the excited nuclei eventually re-align within the presence of the external magnetic field in a process known as relaxation, which has two components, $T_1$ and $T_2$. $T_1$ relaxation describes how the component of the magnetic moment parallel to the external magnetic field returns to its initial value. $T_2$ relaxation describes how the components of the magnetic moment perpendicular to the external magnetic field return to their initial value. Because the magnetic moments of nuclei in the external magnetic field without the RF pulse sequence applied are generally parallel to the external magnetic field, $T_1$ relaxation generally describes how parallel component of the magnetic moment returns to its maximum value, while $T_2$ relaxation generally describes how the perpendicular components of the magnetic moment decay. The nuclei of different material relax at different rates and thus emit differing signals, which can be detected and used to form an image identifying the different materials.

In medical applications, MR imaging is used to view tissue within the human body. Tissues within the human body are replete with water and fat molecules. The water and fat molecules contain hydrogen atoms, which consist of a single proton. MR imaging is thus most often used to map the location of water and/or fat within the human body. The contrast between the signal from the water and/or fat and other material or substances within the human body is used to create an image suitable for diagnostic purposes.

A variety of specific MR imaging techniques have been developed. Many of these techniques involve altering aspects of the RF pulse sequence, as well as utilizing a variety of different detection schemes, in order to create images that show various aspects of the tissue being examined. One such MR imaging technique is known as chemical exchange saturation transfer (CEST). CEST imaging takes advantage of two physical phenomena of tissue under examination. The first phenomenon is known as chemical exchange. In certain tissues, different pools of material can be in chemical exchange with each other. For example, a tissue may contain a solution of water and another material (the solute). When the water molecules are in chemical exchange with molecules of the solute, the two materials can exchange hydrogen atoms—the nuclei of which contain single protons—with each other. The two materials thus can undergo constant chemical exchange with each other where they exchange protons. The rate of exchange of protons from water to the solute can be expressed as $k_{ws}$, while the rate of exchange of protons from the solute to water can be expressed as $k_{sw}$. The second physical phenomena relevant to CEST imaging is known as magnetic saturation. The applied RF pulse sequence can be designed such that the nuclei of a material become saturated and do not emit a signal that is detectable as part of the MR imaging sequence. The strength of the signal that detected from this material is thus reduced or eliminated.

CEST imaging combines these two physical phenomena. Generally, the applied RF pulse sequence is tuned to the resonant frequency of the solute material and is designed so as to saturate the hydrogen atoms of the solute material in the tissue. As this material becomes saturated, the signal it emits during MR imaging is reduced. Because the solute is in chemical exchange with the water in the tissue, the solute can exchange a saturated proton (hydrogen atom) with an unsaturated proton from the water. Because the water now contains a saturated proton, the signal emitted by the water is reduced. As the RF pulse sequence is continually applied to the tissue, the new unsaturated proton in the solute becomes saturated, at which point the solute can again exchange one of its saturated protons with an unsaturated proton of water. Because the amount of water molecules in the tissue generally far outnumbers the amount of molecules of the substance and the signal emitted by the water is thus more easily detected, the reduction in the strength of the signal emitted by the water can be recorded and used to detect the location and shape of the solute.

The CEST effect on tissue containing water and a solute material can be quantified by solving for the Bloch-McConnell equation, shown below:

$$\frac{d}{dt}\begin{bmatrix} M_{xw} \\ M_{yw} \\ M_{zw} \\ M_{xs} \\ M_{ys} \\ M_{zs} \end{bmatrix} = \begin{bmatrix} -\frac{1}{T_{2w}}-k_{ws} & \Delta\omega_w & & k_{sw} & & \\ \Delta\omega_w & -\frac{1}{T_{2w}}-k_{ws} & -\Delta\omega_1 & & k_{sw} & \\ & -\Delta\omega_1 & -\frac{1}{T_{1w}}-k_{ws} & & & k_{sw} \\ k_{ws} & & & -\frac{1}{T_{2s}}-k_{sw} & \Delta\omega_s & \\ & k_{ws} & & \Delta\omega_s & -\frac{1}{T_{2s}}-k_{sw} & -\Delta\omega_1 \\ & & k_{ws} & & -\Delta\omega_1 & -\frac{1}{T_{2s}}-k_{sw} \end{bmatrix} \begin{bmatrix} M_{xw} \\ M_{yw} \\ M_{zw} \\ M_{xs} \\ M_{ys} \\ M_{zs} \end{bmatrix} + \begin{bmatrix} 0 \\ 0 \\ \frac{M_{0w}}{T_{1w}} \\ 0 \\ 0 \\ \frac{M_{0s}}{T_{1s}} \end{bmatrix}$$

Here, $M_{x,y,zw}$ represents the magnetization of the water protons in the x, y, and z directions, while $M_{x,y,zs}$ represents the magnetization of the solute material protons in the x, y, and z directions. $M_{0s}$ represents the number or concentration of solute material protons, and $M_{0w}$ represents the number or concentration of water material protons. $T_{1w}$ and $T_{2w}$ describes the relaxation of the water protons, while $T_{1s}$ and $T_{2s}$ describe the relaxation of the solute material protons. $k_{ws}$ describes the exchange rate of protons from the water to the solute material, while $k_{sw}$ describes the exchange rate of protons from the solute material to the water. The relationship between $k_{ws}$ and $k_{sw}$ is show by the equation $k_{ws}=f_r k_{sw}$, where $f_r=M_{0s}/M_{0w}$ is the ratio of solute material protons to water protons. $\omega_1$ is the power or amplitude of the applied RF pulse sequence. $\Delta\omega_w$ represents the difference between the resonant frequency of the water protons $\delta_w$ and the frequency of the RF pulse sequence. Similarly, $\Delta\omega_s$ represents the difference between the resonant frequency of the solute material protons $\delta_s$ and the frequency of the RF pulse sequence. The resonant frequencies of the water protons $\delta_w$ and the solute material protons $\delta_s$ are represented in terms of their chemical shifts. The solute material's chemical shift is defined as $$\delta_s = \frac{v_s - v_{ref}}{v_{ref}},$$

where $v_s$ is the resonant frequency of the solute material protons in hertz and $v_{ref}$ is the resonant frequency of a reference material in hertz. Similarly, water's chemical shift is defined as $$\delta_w = \frac{v_w - v_{ref}}{v_{ref}},$$

where $v_w$ is the resonant frequency of the water protons in hertz and $v_{ref}$ is the resonant frequency of the reference material in hertz. In MR imaging applications, the value of the chemical shift of water and of common solute materials is generally on the order of $10^{-6}$, and thus may be expressed in parts per million (ppm).

$\Delta\omega$ is the frequency offset of the applied RF pulse sequence, and is defined as $$\Delta\omega = \frac{f_{RF} - v_{ref}}{v_{ref}},$$

where $f_{RF}$ is the frequency of the applied RF pulse sequence in hertz. In some implementations, the frequency of the applied RF pulse sequence in hertz is equal to the resonant frequency of the solute material in hertz. In these implementations, $f_{RF}=v_{ref}+(v_s-v_{ref})=v_s$ such that $\Delta\omega=\delta_s$. In other implementations, the frequency of the of the applied RF pulse sequence in hertz is equal to the opposite resonant frequency of the solute material in hertz. In these implementations, $f_{RF}=v_{ref}-(v_s-v_{ref})=2v_{ref}-v_s$ such that $\Delta\omega=-\delta_s$. Thus, if the resonant frequency of the solute material protons is n Hz greater than the resonant frequency of the reference material, the opposite resonant frequency is n Hz less than the resonant frequency of the reference material. Correspondingly, if the resonant frequency of the solute material protons is n Hz less than the resonant frequency of the reference material, the opposite resonant frequency is n Hz greater than the resonant frequency of the reference material.

Referring now to FIG. 1, a method 100 of determining the exchange rate between a solute material and a water solvent in chemical exchange with each other is illustrated. Method 100 (and other methods disclosed herein) can be utilized with biological samples such as human tissue, non-biological sample, or any other suitable sample containing a first material in chemical exchange with a second material. At step 102, a CEST scan is performed at the resonant frequency of the solute material and the intensity of the resulting water signal is measured. The CEST scan refers to a scan where an external magnetic field is applied to a sample, and an RF pulse sequence is applied that saturates the solute material. Because the solute material is in chemical exchange with water, the intensity of resulting signal from the water protons (the "water signal") is reduced. One or more water signals may be combined to obtain a data signal. The power of an applied RF pulse sequence that saturates the solute material protons is referred to as the saturation power $B_1$. Similarly, the length of time for which the RF pulse sequence is applied is referred to as the saturation time $T_{sat}$. The saturation power and the saturation time affect the degree to which the water protons are saturated, and thus affect the intensity of the resulting water signal and the data signal that is obtained.

At step 104, a plurality of CEST scans of the sample are simulated at the solute resonant frequency. The intensity of the resulting (simulated) water signals is calculated to obtain a plurality of dictionary signals. The plurality of CEST scans are simulated using the Bloch-McConnell equation show herein. For purposes of simulating the CEST scans, $T_1$ and $T_{2w}$ can be taken from known values of the relaxation parameters of water, or can be determined by performing standard measurements. $T_{1s}$ can be set as equal to $T_{1w}$, and $T_{2s}$ can determined from known values of the solute material that is being examined. $\omega_1$ is set as equal to the power of the RF pulse sequence that was actually applied to the sample in step 102. $f_r=M_{0s}/M_{0w}$ is a constant and can be set equal to a negligible value, such as 0.0001. Each of the plurality of simulated CEST scans are simulated with the same saturation power and saturation time as the performed CEST scan. The plurality of dictionary signals provides potential matches for the data signal that is measured based on an actual CEST scan of the sample. Thus, each of the plurality of dictionary signals is simulated at one of a plurality of candidate exchange rates $k_{sw}$. In an implementation, sixty CEST scans are simulated having $k_{sw}$ values between about 10 $s^{-1}$ and 600 $s^{-1}$ in intervals of about 10 $s^{-1}$. In this implementation, sixty dictionary signals are obtained as potential matches to the single data signal.

At step 106, the data signal is matched to one of the plurality of dictionary signals by determining the vector dot product between the data signal and each of the plurality of dictionary signals. The dictionary signal with the highest vector dot product is selected as the best approximation of the measured data signal. Thus, candidate exchange rate $k_{sw}$ of the matched dictionary signal is determined to be the exchange rate of the solute material of the sample. In some implementations, the exchange rate can be correlated with the pH of the solute material using a known relationship. In other implementations, the exchange rate at which the matched dictionary signal was simulated can also be used for other purposes.

Figure 2A:
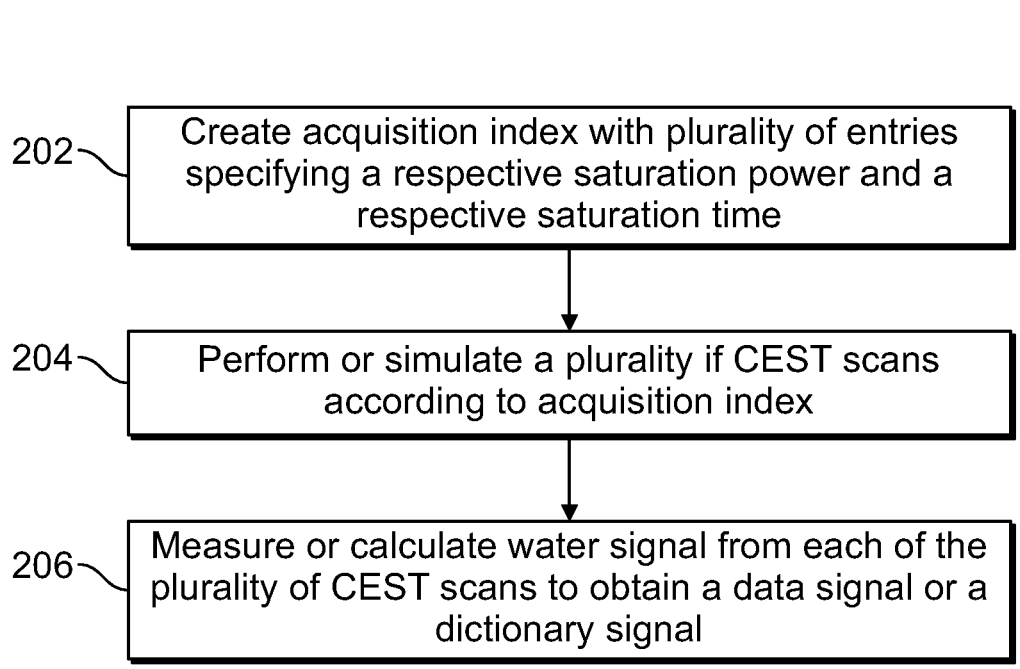
FIG. 2A is a flow chart of a method for obtaining a data signal or a dictionary signal, according to aspects of the present disclosure.
Figure 2B:
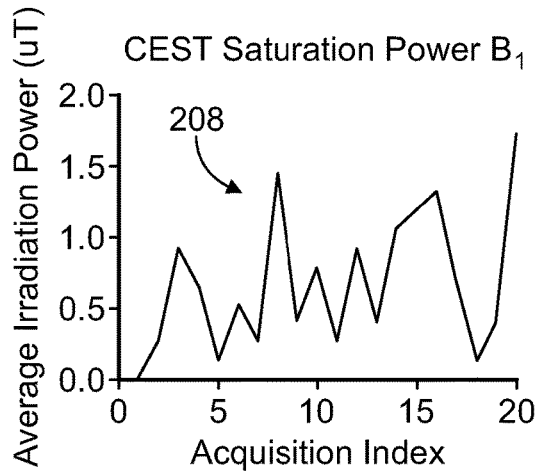
FIG. 2B is a graph of a saturation power specified by each entry in an acquisition index, according to aspects of the present disclosure.
Figure 2C:
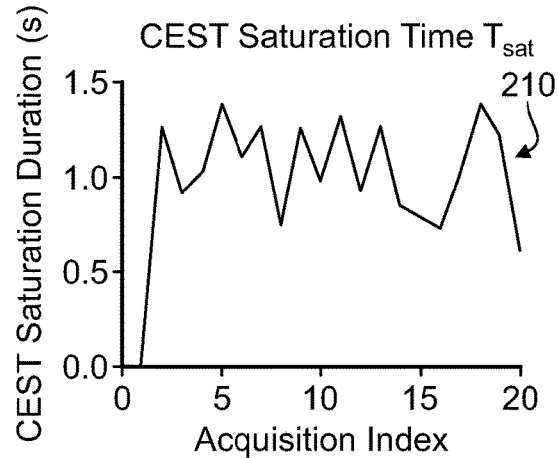
FIG. 2C is a graph of a saturation time specified by each entry in the acquisition index of FIG. 2B, according to aspects of the present disclosure.

Referring now to FIG. 2A, a method 200 of obtaining a data signal or a dictionary signal is illustrated. At step 202, an acquisition index is created with a plurality of entries. Each of the entries in the acquisition index specifies a respective saturation power and a respective saturation time that a CEST scan can be performed or simulated at. FIG. 2B illustrates an implementation of the acquisition index having twenty entries, where each entry specifies a saturation power of between about greater than about 0.0 µT a and less than about 2.0 µT. The saturation power for a given scan is generally defined as the average irradiation power. As shown in graph 208 of FIG. 2B, the saturation power for each of the twenty entries in the acquisition index varies randomly between about 0.0 µT a and about 2.0 µT. FIG. 2C illustrates an implementation of the acquisition index where each of the twenty entries specifies a saturation time (e.g. the duration that the saturation signal is applied) of between about greater than 0.0 seconds and less than about 1.5 seconds. Similar to graph 208, graph 210 of FIG. 2C shows that the saturation time for each of the twenty entries in the acquisition index varies randomly between about 0.0 seconds and about 1.5 seconds. In some implementations, the saturation power is randomly selected within this range to minimize spillover, e.g. direct saturation of the water protons by the RF pulse sequence. Direct saturation of the water protons contributes to a reduction in the intensity of the water signal that is not attributable to the solute material protons. Once the saturation power for a given acquisition index entry is chosen, the saturation time for that entry can be chosen such that the intensity of the water signal that results from that CEST scan is a pre-determined percentage of the intensity of a steady-state water signal, which is the maximum intensity of the resulting water signal that can be achieved for any given saturation power and the time the RF pulse sequence is applied goes to infinity. In an implementation, the pre-determined percentage is about 50%. In another implementation, the pre-determined percentage is between about 40% and about 60%. In additional implementations, the saturation power can be between about 0.0 µT and about 10.0 µT, between about 5.0 µT and about 10.0 µT, between about 0.0 µT and about 5.0 µT, between about 0.0 µT and about 4.0 µT, between about 2.0 µT and about 4.0 µT, or between about 0.0 µT and about 1.0 µT. In still other implementations, the saturation time can be between about 0.0 seconds and about 10.0 seconds, between about 5.0 seconds and about 10.0 seconds, between about 0.0 seconds and about 5.0 seconds, between about 0.0 seconds and about 4.0 seconds, between about 2.0 seconds and about 4.0 seconds, between about 0.0 seconds and about 1.0 seconds, between about 1.0 seconds and about 1.5 seconds, or between about 0.0 seconds and about 0.5 seconds.

Figure 2D:
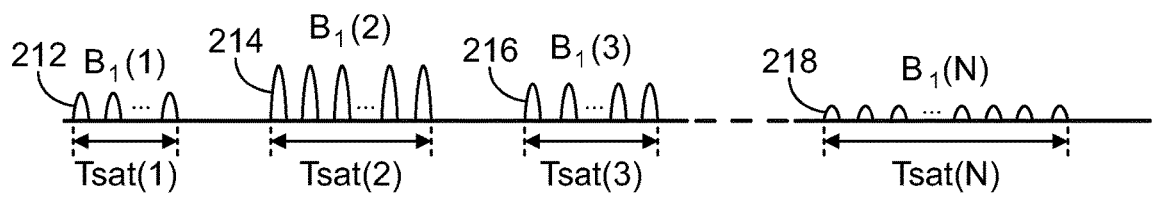
FIG. 2D is an illustration of a plurality of CEST scans that are performed or simulated according to the acquisition index of FIG. 2B, according to aspects of the present disclosure.

At step 204 of method 200, a plurality of CEST scans are performed or simulated according to the acquisition index. The number of CEST scans that are performed is equal to the number of entries in the acquisition index. For each entry in the acquisition index, a CEST scan having the saturation power and the saturation time specified by that entry is performed. This procedure is illustrated graphically in FIG. 2D, which shows the power of multiple applied RF pulse sequences (e.g. multiple CEST scans) and the length of time for which the RF pulse sequence is applied. The first RF pulse sequence 212 has a power of $B_1(1)$ and is applied for a time $T_{sat}(1)$, as specified by the first entry in the acquisition index. The second RF pulse sequence 214 has a power of $B_1(2)$ and is applied for a time $T_{sat}(2)$, as specified by the second entry in the acquisition index. The third RF pulse sequence 216 has a power of $B_1(3)$ and is applied for a time $T_{sat}(3)$, as specified by the third entry in the acquisition index. The nth RF pulse sequence 218 has a power of $B_1(n)$ and is applied for a time $T_{sat}(n)$, as specified by the nth entry in the acquisition index. Thus, the nth one of the plurality of performed or simulated CEST scans corresponds to the nth entry in the acquisition index. As can be seen, the saturation power and saturation time specified by each entry and thus each CEST scan is different. In some implementations, the saturation power and/or the saturation time of one entry is equal to the saturation power and/or saturation time of one or more of the other entries. The time between the end of the application of one RF pulse sequence and the beginning of the application of a subsequent RF pulse sequence can be about 1000 milliseconds.

Figure 2E:
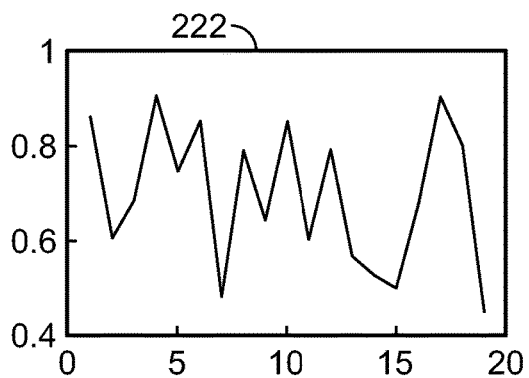
FIG. 2E is a graph of a data signal or a dictionary signal obtained by performing or simulating the plurality of CEST scans of FIG. 2D, according to aspects of the present disclosure.

At step 206 of method 200, the intensity of the resulting water signals is measured (for performed CEST scans) or calculated (for simulated CEST scans) after the saturation time has elapsed to obtain a plurality of data points. These data points, which indicate the intensity of each of the resulting water signals, can be plotted against the number of entries in the acquisition index to form signal 222, as shown in FIG. 2E. The signal 222 is a data signal when the CEST scans in step 204 are performed and the intensities of the water signals in step 204 are measured. The signal 222 is a dictionary signal when the CEST scans in step 204 are simulated and the intensities of the water signals in step 204 are calculated. Method 200 can be used to obtain both a data signal and a dictionary signal that are used with method 100. The nth data point in the dictionary signal is therefore a simulation of the nth data point of the data signal. Because the saturation power and the saturation time for each entry in the acquisition index is pseudorandomly chosen, the signal 222 comprises a unique signal evolution that is resistant to noise.

Figure 3A:
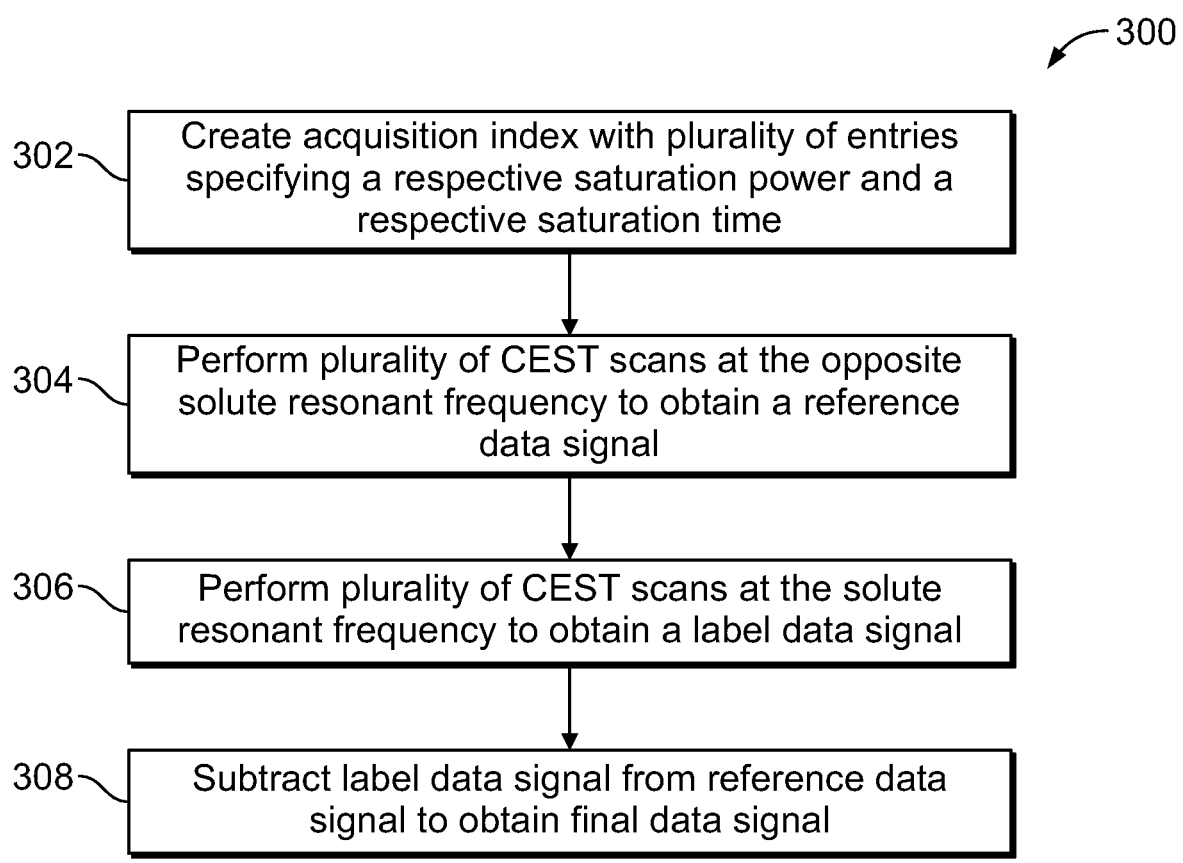
FIG. 3A is a flow chart of a method for obtaining a final data signal, according to aspects of the present disclosure.

Referring now to FIG. 3A, a method 300 of obtaining a final data signal is shown. At step 302, an acquisition index containing a plurality of entries specifying a saturation power and a saturation time is created. This step is substantially identical to step 202 of method 200. At step 304, a plurality of CEST scans are performed at the opposite solute resonant frequency according to the acquisition index to obtain a reference data signal. This step is similar to steps 204 and 206 of method 200. However, each of the plurality of CEST scans in step 304 is performed at the opposite resonant frequency of the solute material ($f_{RF}=v_{ref}-(v_s-v_{ref})$ such that $\Delta\omega=-\delta_s$) and no CEST effect is observed. Because each of the these CEST scans are performed at the opposite resonant frequency of the solute material protons, the solute material protons are not saturated by the applied RF pulse sequence and do not transfer this saturation to the water protons, regardless of the saturation power and the saturation time of the applied RF pulse sequence.

Figure 3B:
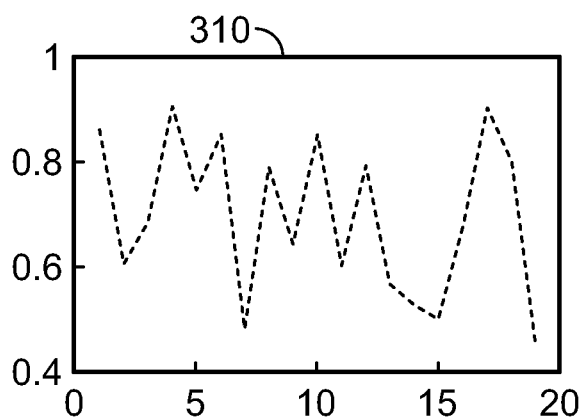
FIG. 3B is a graph of a reference data signal, according to aspects of the present disclosure.

The intensity of the individual water signals that result from these CEST scans is due to effects other than the CEST phenomenon, such as any absorption and emission of the applied RF pulse sequence, the water protons being directly saturated by the applied RF pulse sequence, or by what is known as the magnetization transfer (MT) effect. The MT effect is due to the solute material protons transferring their magnetization state to water protons, rather than actual protons being exchanged between the two materials. Any water signal loss due to the MT effect is not related to the exchange rate between the solute material and the water, and thus is not correlated with the pH of the solute material. The CEST scans that are performed at the opposite resonant frequency of the solute material thus provide a baseline or reference signal intensity for when no CEST effects are present. The resulting intensity of the water signal for each of the CEST scans is measured and combined to form a reference data signal 310, as shown in FIG. 3B. The reference data signal 310 shows the evolution of the measured water signals when the CEST scans are performed at the opposite resonant frequency and according to the saturation powers and times specified by the acquisition index.

Figure 3C:
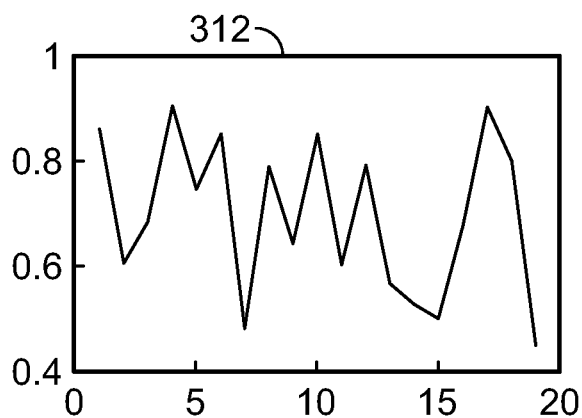
FIG. 3C is a graph of a label data signal, according to aspects of the present disclosure.

At step 306, a plurality of CEST scans are performed at the solute resonant frequency according to the acquisition index to obtain a label data signal 312, as shown in FIG. 3C. The label data signal 312 is a measure of the intensity of the resulting water signal at each entry in the acquisition index. The label data signal 312 generally corresponds to the reference data signal 310, in that the nth CEST scan for both data signals is performed at the saturation power and saturation time specified by the nth entry in the acquisition index. However, because the CEST scans that are performed to obtain the label data signal 312 are performed at the solute resonant frequency instead of the opposite solute resonant frequency, the intensity of the resulting water signals from these CEST scans is based on everything that contributed to the intensity of the reference data signal 310, in addition to the CEST effect. Due to the presence of the CEST effect, the value of the label data signal 312 at any entry in the acquisition index is less than the value of the reference data signal 310 at that same entry in the acquisition index, e.g. the presence of the CEST effect in the label data signal 312 causes a reduction in the intensity of the resulting water signals for any given entry in the acquisition index, as compared to the reference data signal 310.

Figure 3D:
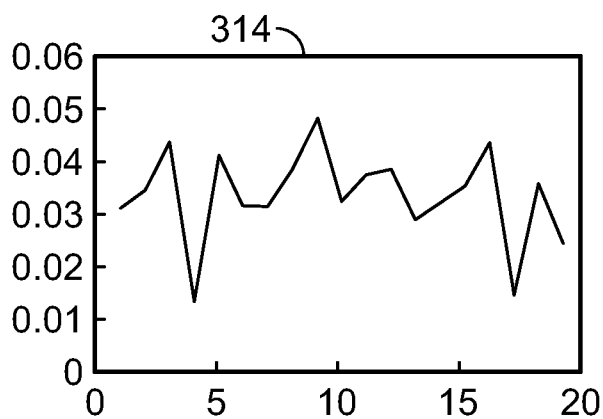
FIG. 3D is a graph of a final data signal, according to aspects of the present disclosure.

At step 308, the label data signal 312 is subtracted from the reference data signal 310 to obtain a final data signal 314, as shown in FIG. 3D. Because the only difference between the intensity of the reference data signal 310 and the label data signal 312 is the CEST effect, subtracting the label data signal 312 from the reference data signal 310 (e.g. subtracting the intensity of the label data signal 312 at entry n from the intensity of the reference data signal 310 at entry n) results in the final data signal 314 that is a measure of how much the intensity of the resulting water signals is reduced following each individual CEST scans, due only to the CEST effect. As can be seen from comparing the graphs in FIGS. 3B-3D, the values of the reference data signal 310 and the label data signal 312 are generally similar, and the scale of the final data signal 314 in FIG. 3D is reduced as compared to the graphs in FIG. 3B and FIG. 3C.

Figure 4A:
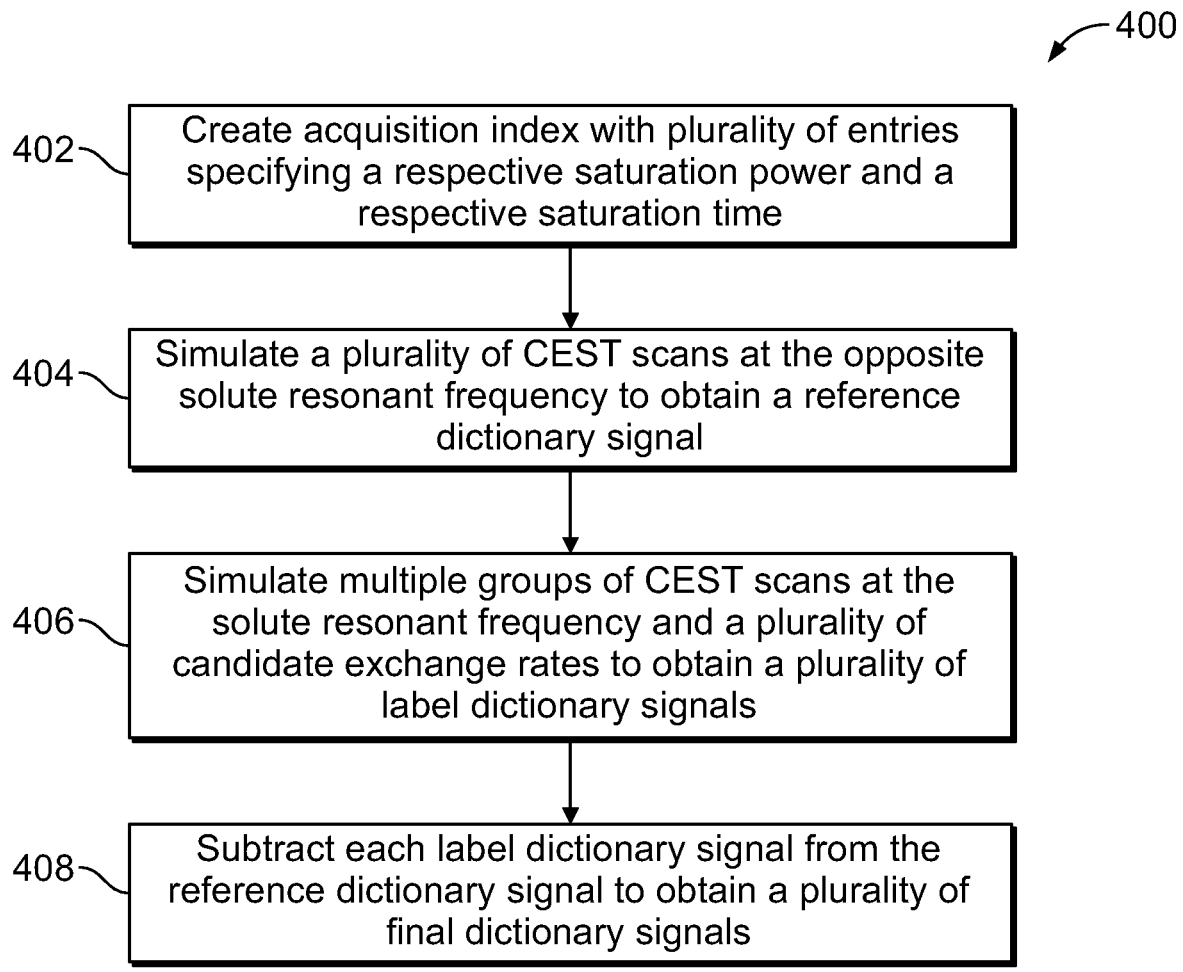
FIG. 4A is a flowchart of a method for obtaining a plurality of final dictionary signals, according to aspects of the present disclosure.
Figure 4B:
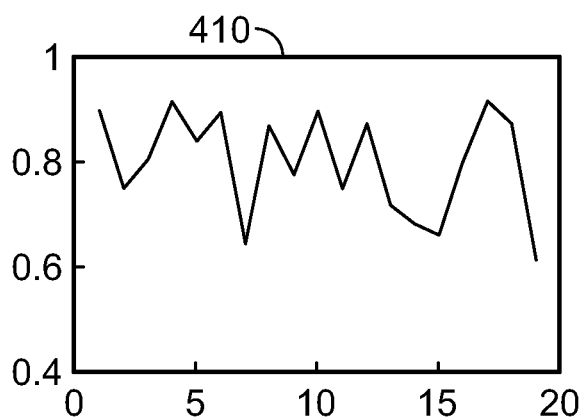
FIG. 4B is a graph of a reference dictionary signal, according to aspects of the present disclosure.

Referring now to FIG. 4A, a method 400 of obtaining a final dictionary signal is illustrated. At step 402, the acquisition index is created. Each entry of the acquisition index specifies a saturation power and a saturation time. The acquisition index used in method 400 to obtain the final dictionary signal is the same acquisition index used in method 300 to obtain the final data signal. At step 404, a plurality of CEST scans are simulated according to the acquisition index. Each of these plurality of CEST scans are simulated at the opposite solute resonant frequency. The intensity of the water signal from each of the simulated CEST scans is calculated and plotted against the acquisition index to form reference dictionary signal 410, as shown in FIG. 4B. The reference dictionary signal 410 is a simulation of the reference data signal 310, e.g. each point in the reference dictionary signal 410 (the calculated intensity of the water signal) is a simulation of the corresponding point in the reference data signal 310 (the measured intensity of the water signal).

The plurality of CEST scans that are simulated to obtain the reference dictionary signal 410 are simulated using similar parameters as the CEST scans that were simulated in step 104 of method 100. The CEST scans are simulated using the Bloch-McConnell equations, where $T_{1w}$ and $T_{2w}$ can be taken from known values of the relaxation parameters of water or can be determined by performing standard measurements, $T_{1s}$ can be set as equal to $T_{1w}$, and $T_{2s}$ can be taken be taken from known values of the solute material that is being examined. For each simulated CEST scan, $\omega_1$ is set as equal to the saturation power specified by the corresponding entry in the acquisition index. In contrast to step 104 however, only a single reference dictionary signal is obtained. This is because each of the plurality of CEST scans simulated in step 404 is simulated at the opposite solute resonant frequency. As such, there is no CEST effect, and the value of the exchange rate $k_{sw}$ is irrelevant to the calculated intensity of the water signal resulting from the simulated CEST scans. Thus, both $k_{sw}$ and $f_r$ can be set equal to 0 for the CEST scans that are simulated to obtain the reference dictionary signal. Similar to the reference data signal, the reference dictionary signal is a simulation of baseline water signal strength when no CEST effects are present.

Figure 4C:
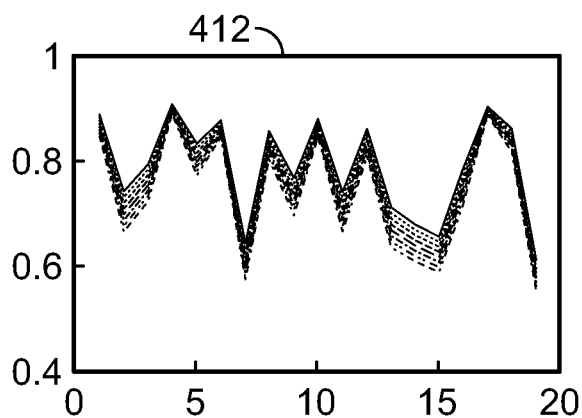
FIG. 4C is a graph of a plurality of label dictionary signals, according to aspects of the present disclosure.

At step 406, multiple groups of CEST scans are simulated using the Bloch-McConnell equation to obtain a plurality of label dictionary signals 412, as shown in FIG. 4C. Each group includes a plurality of simulated CEST scans that are simulated at a single respective candidate exchange rate. All of the CEST scans that are simulated at step 406 (across all of the groups) are simulated according to the acquisition index and at the solute resonant frequency. For example, one group of CEST scans may be designated with an exchange rate $k_{sw}=100$ s$^{-1}$. A plurality of CEST scans having an exchange rate of $k_{sw}=100$ s$^{-1}$ are then simulated at the solute resonant frequency and according to the acquisition index. The intensity of the resulting water signal from each of these simulated CEST scans is calculated and combined to form a single label dictionary signal that is indicative of the signal that would result if a CEST scan was performed on a sample having an exchange rate $k_{sw}=100$ s$^{-1}$. By simulating a plurality of groups of CEST scans, a plurality of label dictionary signals—each corresponding to a single candidate exchange rate—can be obtained. In an implementation, sixty groups of CEST scans are simulated, each group having a $k_{sw}$ value between about 10 s$^{-1}$ and about 600 s$^{-1}$ in intervals of about 10 s$^{-1}$. The variable $f_r$ can be set equal to 0.0001. The remaining variables in the Bloch-McConnell equation can be set to values equal to those used to obtain the reference dictionary signal. Similar to the label data signal, each of the label dictionary signal is a simulation of the intensity of the water signal due to a variety of factors including the CEST effect.

Figure 4D:
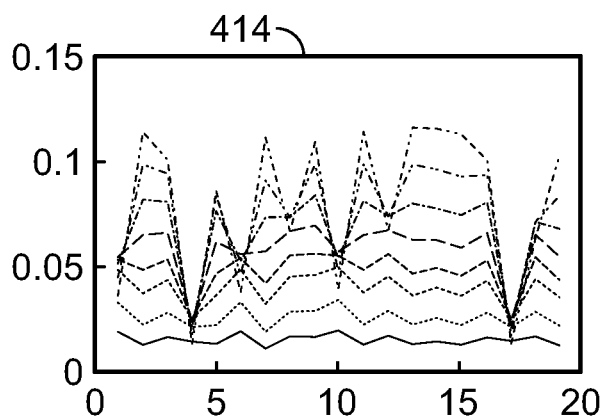
FIG. 4D is a graph of a plurality of final dictionary signals, according to aspects of the present disclosure.

At step 408, each of the plural of label dictionary signals 412 is subtracted from the reference dictionary signal 410 to obtain a plurality of final dictionary signals 414, as shown in FIG. 4D. Similar to the reference data signal 310 and the label data signal 312, each point in the reference dictionary signal 410 is a simulation of the water signal intensity in the absence of the CEST effect, and thus is greater than the corresponding point in each of the label dictionary signals 412, which are simulations of the water signal intensity in the presence of the CEST effect. By subtracting each of the label dictionary signals 412 from the reference dictionary signal 410 (e.g. subtracting the intensity of each of the label dictionary signals 412 at entry n from the intensity of the reference dictionary signal 410 at entry n), the plurality of final dictionary signals 414 indicate how much the intensity of the simulated water signals is reduced due only to the CEST effect, at a variety of different candidate exchange rates.

In some implementations, the CEST scans are performed and simulated at exactly the solute resonant frequency and the opposite solute resonant frequency. In other implementations, the CEST scans are performed and simulated at a plurality of frequencies around the solute resonant frequency and the opposite solute resonant frequency, and the intensity of the resulting water signals is interpolated from the results. The need to interpolate the intensity of the resulting water signals can stem from the resonant frequency of the water protons generally being inhomogeneous across the sample, as well as inhomogeneities in the external magnetic field $B_1$. For example, if the solute resonant frequency of the solute material is $\delta_s=2.0$ ppm, CEST scans may be performed and simulated at $\delta_s=1.4$ ppm, 1.7 ppm, 2.0 ppm, 2.3 ppm, and 2.6 ppm. The intensity of the resulting water signals can be measured and simulated to obtain a plurality of partial label data signals or a plurality of partial label dictionary signals, which can be interpolated to determine a label data signal or a plurality of label dictionary signals. Similarly, CEST scans can be performed and simulated at $\delta_s=-1.4$ ppm, $-1.7$ ppm, $-2.0$ ppm, $-2.3$ ppm, and $-2.6$ ppm to obtain a plurality of partial reference data signals and a plurality of partial reference dictionary signals, which can then be interpolated to determine a reference data signal and a reference dictionary signal.

While the reference dictionary signal 410 and the plurality of label dictionary signals 412 are simulations of performed CEST scans, the simulations do not take into account the magnetization transfer (MT) effect, which can reduce the intensity of the water signals and is not related to the exchange rate between the solute material and the water. FIG. 5 illustrates a method 500 for correcting a reference dictionary signal and each of a plurality of label dictionary signals for the MT effect. At step 502, the acquisition index is created with each entry specifying a saturation power and a saturation time. At step 504, a reference data signal and a label data signal are obtained. The reference data signal can be obtained according to step 304 of method 300, while the label data signal can be obtained according to step 306 of method 300. At step 506, a reference dictionary signal and a plurality of label dictionary signals are obtained. The reference dictionary signal can be obtained according to step 404 of method 400, while the plurality of label dictionary signals can be obtained according to step 406 of method 400.

Figure 5A:
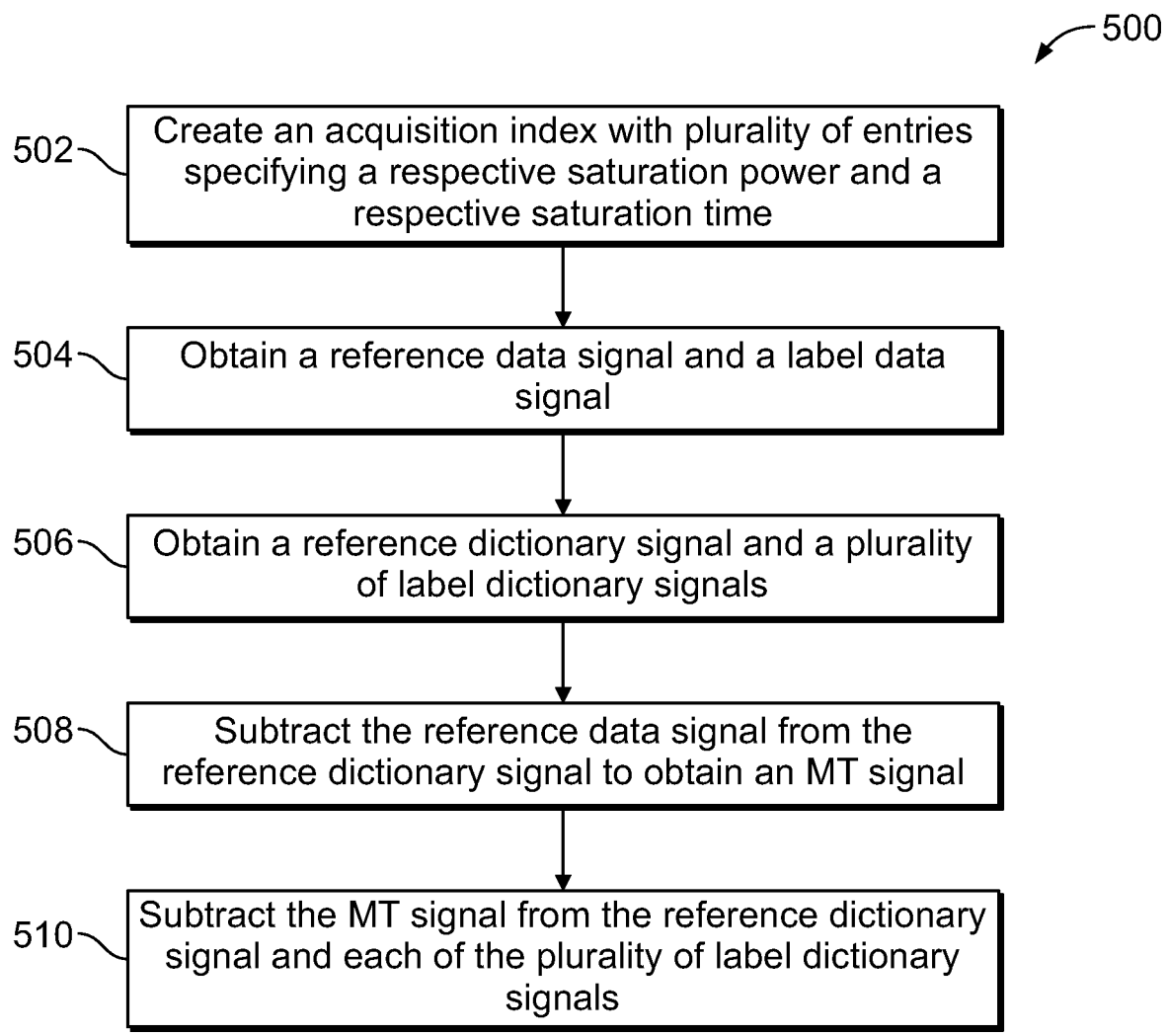
FIG. 5A is a flowchart of a method for correcting a reference dictionary signal and each of a plurality of label dictionary signals for a magnetization transfer effect, according to aspects of the present disclosure.
Figure 5B:
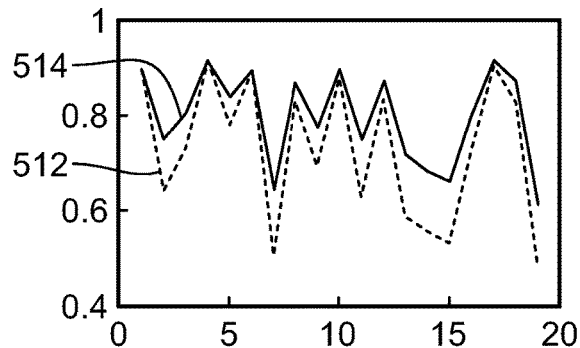
FIG. 5B is a graph of a reference dictionary signal and a reference data signal, according to aspects of the present disclosure.
Figure 5C:
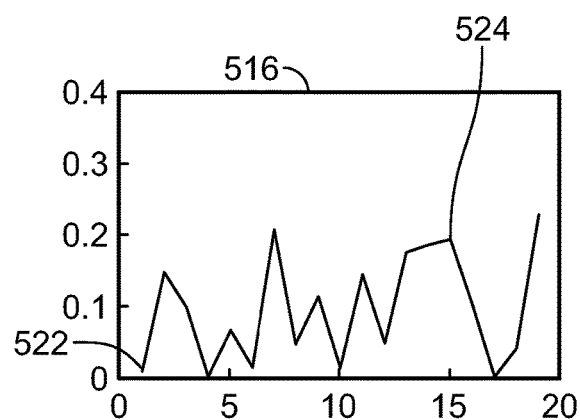
FIG. 5C is a graph of a magnetization transfer signal, according to aspects of the present disclosure.

At step 508, the reference data signal 512 is subtracted from the reference dictionary signal 514. A comparison between the reference data signal 512 and the reference dictionary signal 514 is shown in FIG. 5B. Because the simulated CEST scans do not take into account the MT effect, the magnitude of the reference dictionary signal 514 (e.g. the calculated intensity of the simulated water signals) is greater than the magnitude of the reference data signal. The difference between each data point of the signals is the magnitude of the MT effect at each data point, which can be combined to obtain an MT signal 516 in FIG. 5C. The MT signal 516 shown in FIG. 5C illustrates how much the intensity measured water signals are reduced when obtaining reference data signal as compared to the intensity of the water signals that are calculated when the reference dictionary signal is simulated.

Figure 5D:
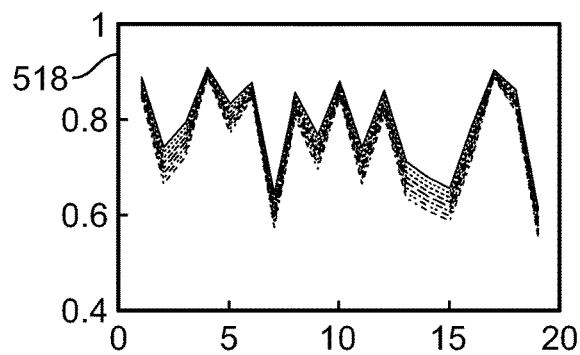
FIG. 5D is a graph of an uncorrected label dictionary signal, according to aspects of the present disclosure.
Figure 5E:
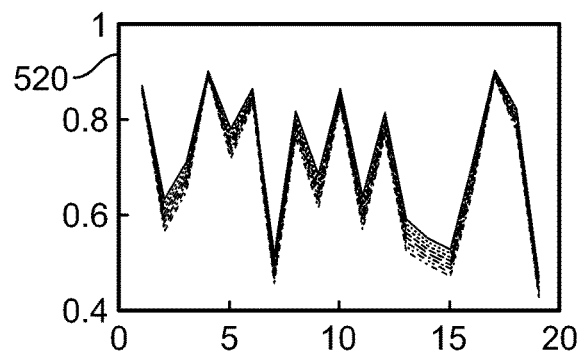
FIG. 5E is a graph of a corrected label dictionary signal, according to aspects of the present disclosure.

At step 510, the MT signal is subtracted from both the reference dictionary signal and each of the plurality of label dictionary signals to correct the reference dictionary signal and each of the plurality of label dictionary signals. Uncorrected versions 518 of the plurality of label dictionary signals are shown in FIG. 5D, while corrected versions 520 of the plurality of label dictionary signals are shown in FIG. 5E. At entries in the acquisition index where the specified saturation power and saturation time resulted in minimal (or zero) MT effect-related reduction in the measured water signal (such as entry #1 522), the value of the uncorrected label dictionary signal and the corrected label dictionary signal are substantially similar. At entries in the acquisition index where the specified saturation power and saturation time resulted in a substantial MT effect-related reduction in the measured water signal (such as entry #15 524), the value of the uncorrected label dictionary signal is greater than the value of the corrected label dictionary signal. Because the value of the MT signal indicates how much the intensity of the resulting water signals should be reduced at each entry in the acquisition index, subtracting the MT signal from the dictionary signals results in dictionary signals that are more accurate simulations of the actual physical phenomena that occur when CEST scans are performed. The intensity of the resulting water signals can also be reduced due to other phenomena, such as direct water saturation. However, these other phenomena are accounted for when simulating the CEST scans using the Bloch-McConnell equations, and thus do not need to be corrected for in a fashion similar to the MT effect.

Figure 6:
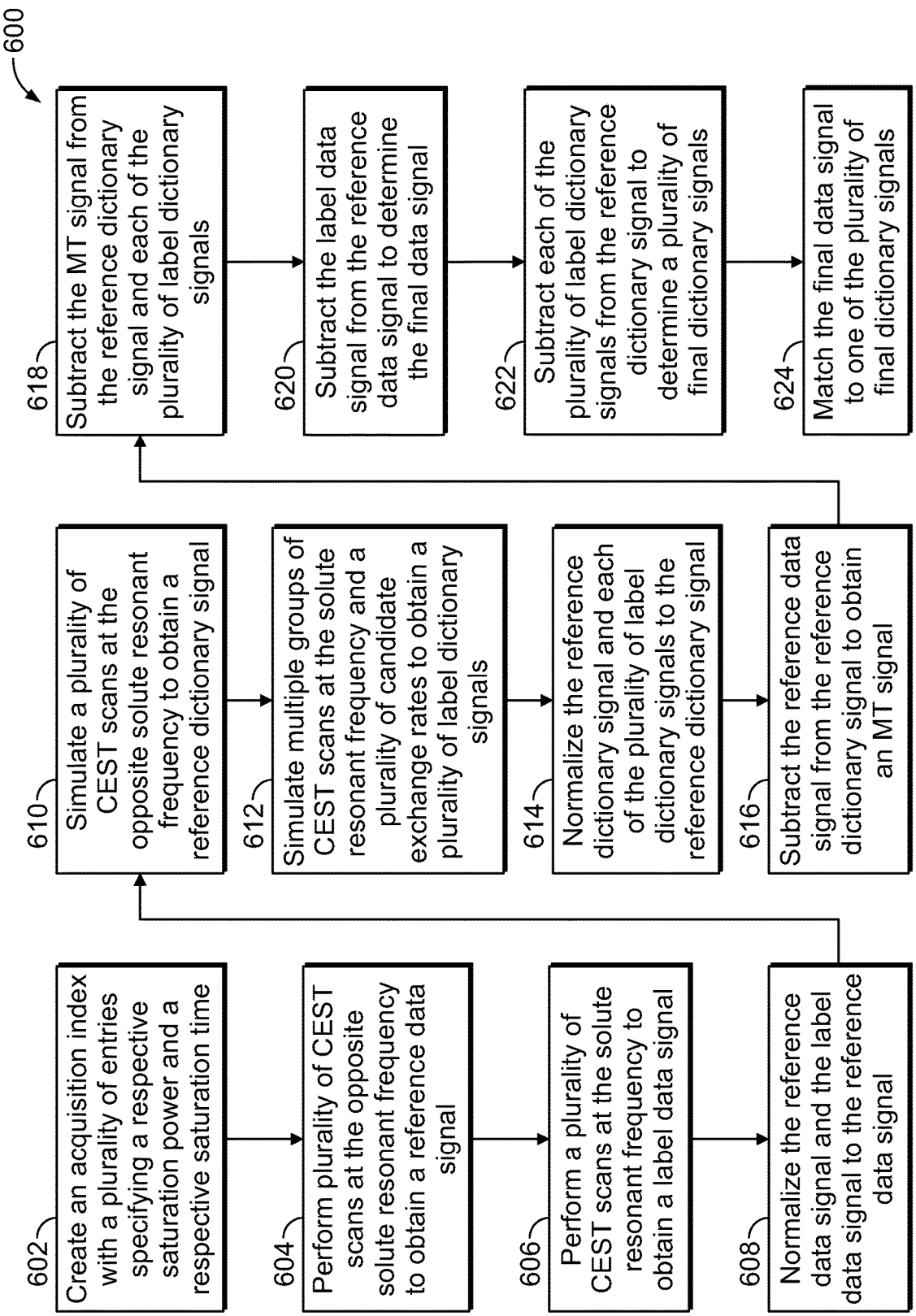
FIG. 6 is a flow chart of a method for determining an exchange rate between a solute material and a solvent material in chemical exchange with each other, according to aspects of the present disclosure.

Referring now to FIG. 6, a method 600 for determining the exchange rate $k_{sw}$ of a solute material that is in chemical exchange with water is illustrated. Method 600 is similar to various methods described herein, and illustrates the entire process for determining the exchange rate. At step 602, an acquisition index is created. The acquisition index contains a plurality of entries n, each entry specifying a saturation power and a saturation time that each of the CEST scans will be performed or simulated at. At step 604, a plurality of CEST scans are performed at the opposite solute resonant frequency according to the acquisition index, e.g. the nth CEST scan is performed using the saturation power and saturation time specified by the nth entry in the acquisition index. The intensity of the resulting water signal from each CEST scan is measured and combined to form a reference data signal. Because the CEST scans in step 604 are performed at the opposite solute resonant frequency, the reference data signal provides a baseline for the intensity of the resulting water signals in the absence of the CEST effect (but in the presence of the MT effect). At step 606, a plurality of CEST scans are performed at the solute resonant frequency according to the acquisition index. The intensity of the resulting water signal from each CEST scan is measured and combined to form a label data signal. Because the CEST scans in step 606 are performed at the solute resonant frequency, the label data signal shows the intensity of the resulting water signals in the presence of everything that contributed to the reference data signal (including the MT effect), but also in the presence of the CEST effect. At step 608, both the reference data signal and the label data signal are normalized to the reference data signal, e.g. the performed scan where no CEST effect is present.

At step 610, a plurality of CEST scans are simulated at the opposite solute resonant frequency according to the acquisition index. The intensity of the simulated water signal from each CEST scan is calculated and combined to form a reference dictionary signal. Because the CEST scans in step 610 are simulated at the opposite solute resonant frequency, the calculated intensity of the simulated water signals will not be influenced by the CEST effect, and thus the exchange rate can be set equal to zero in order to simplify the simulations. The reference dictionary signal thus provides a simulation of a baseline for the intensity of the water signals in the absence of the CEST effect, e.g. a simulation of the reference data signal. However, because the CEST scans are simulated using the Bloch-McConnell equations, the reference dictionary signals do not take into account the MT effect.

At step 612, multiple groups of CEST scans are simulated at the solute resonant frequency. Each group of CEST scans includes a plurality of CEST scans that are simulated according to the acquisition index and at one of a plurality of candidate exchange rates. The intensity of the simulated water signals from each CEST scan is calculated and combined to form a plurality of label dictionary signals. Each of these label dictionary signals corresponds to a single candidate exchange rate between the solute protons and the water protons in the sample. Each one of the plurality of label dictionary signals thus provides a simulation of the intensity of a water signal in the presence of the CEST effect, e.g. a potential simulation of the label data signal. Similar to the reference dictionary signals however, because the CEST scans for the label dictionary signals are simulated using the Bloch-McConnell equations, the plurality of label dictionary signals do not take into account the MT effect. At step 614, both the reference dictionary signal and each of the plurality of label dictionary signals are normalized to the reference dictionary signal, e.g. the simulated scan where no CEST effect is present.

At step 616, the reference data signal is subtracted from the reference dictionary signal to determine the MT effect. Because the reference dictionary signal is simulated by using the Bloch-McConnell equation, the reference dictionary signal does not take into account how much the intensity of the water signal is reduced due to the MT effect. Thus, the magnitude of the reference dictionary signal will be greater than the magnitude of the reference data signal. The difference between the two reference signals represents how much the intensity of the water signal is reduced due to the MT effect. This reduction can be graphed in a similar fashion as the data signals and the dictionary signals, by plotting the magnitude of the reduction for each entry in the acquisition index to form an MT signal.

At step 618, the MT effect is incorporated into the reference and label dictionary signals by subtracting the MT signal from the reference dictionary signal and from each of the plurality of label dictionary signals. This results in an MT-corrected version of the reference dictionary signal and MT-corrected versions of each of the plurality of label dictionary signals. Because the initial versions of the dictionary signals represent the intensity of the simulated water signals without taking into account the MT-reduction that occurs when physically performing the CEST scans, the MT-corrected versions of the dictionary signals simulate the lower-intensity water signals that result from actual CEST scans due to the MT effect. The MT-corrected versions of the dictionary signals are thus more accurate simulations of the data signals that are obtained from performing the CEST scans.

At step 620, the label data signal is subtracted from the reference data signal to obtain the final data signal. The reference data signal represents the intensity of a resulting water signal due to the MT effect and to additional effects that may also be present at the opposite solute resonant frequency. The label data signal represents the intensity of a resulting water signal due to the MT effect, the additional effect, and due to the CEST effect. By subtracting the label data signal (lower intensity signal due to the CEST effect, the MT effect, and other effects) from the reference data signal (higher intensity signal due to MT effect and other effects), the final data signal represents the reduction of the intensity of the water signals resulting from performed CEST scans that is based only on the CEST effect. Thus, by obtaining the final data signal in this fashion, the CEST effect that results from performing CEST scans on the sample is isolated and quantified.

At step 622, each of the plurality of label dictionary signals is subtracted from the reference dictionary signal to obtain a plurality of final dictionary signals, similar to step 620. By subtracting each of the plurality of label dictionary signals (simulated lower intensity signals due to the CEST effect, the MT effect, and other effects) from the reference dictionary signal (simulated higher intensity signal due to the MT effect and other effects), the final dictionary signal represents the reduction of the intensity of the water signals resulting from simulated CEST scans that is based only on the CEST effect.

At step 624, the final data signal is compared to the plurality of final dictionary signals. This comparison is done by taking the vector dot product of the final data signal with each of the plurality of final dictionary signals. The vector representing the final data signal comprises the value of the final data signal at each entry in the acquisition index as the corresponding vector component, e.g. the first component of the final data signal vector is the value of the normalized reference data signal for the first entry in the acquisition index minus the value of the normalized label data signal for the first entry in the acquisition index. Similarly, the vectors representing a respective one of the plurality of final dictionary signals comprise the values of each of the final dictionary signals at each entry in the acquisition index as the corresponding vector components. The dot product between the two vectors represents the degree of similarity between the two vectors. Thus, the final dictionary signal having the highest dot product with the final data signal represents the final dictionary signal that best matches the final data signal, e.g. the final data signal that represents the most accurate simulation of the final data signal that was obtained by actually performing CEST scans on the sample. Because each of the final dictionary signals was simulated using a respective candidate exchange rate, the candidate exchange rate of the selected final dictionary signal indicates the exchange rate between the solute material protons and the water protons in the sample.

The principles disclosed herein can also be used to create exchange rate and/or pH-weighted images of the sample. Generally, a cross-sectional area of the sample to be imaged is defined. This cross-sectional area includes a plurality of pixels. Each pixel corresponds to a single unit in the cross-sectional area of the sample where the exchange rate of the solute material can be determined. The exchange rate of the solute material at each pixel is determined according to the principles disclosed herein, and generally includes at least the steps of performing a plurality of CEST scans on the sample to obtain a data signal, simulating a plurality of CEST scans on the sample to obtain a plurality of dictionary signals having respective candidate exchange rates, and matching the data signal to one of the plurality of dictionary signals to determine the exchange rate of the solute material at that pixel. The exchange rate at each pixel can be mapped to the cross-sectional area by correlating the color of the pixel with the exchange rate. This creates a cross-sectional image of the sample where the color of each pixel denotes the exchange rate of the sample at that pixel. If the relationship between the exchange rate of the solute material and the pH of the material is known, the exchange rate at each pixel can be converted to the pH at each pixel and a pH-weighted image can be created.

Figure 7:
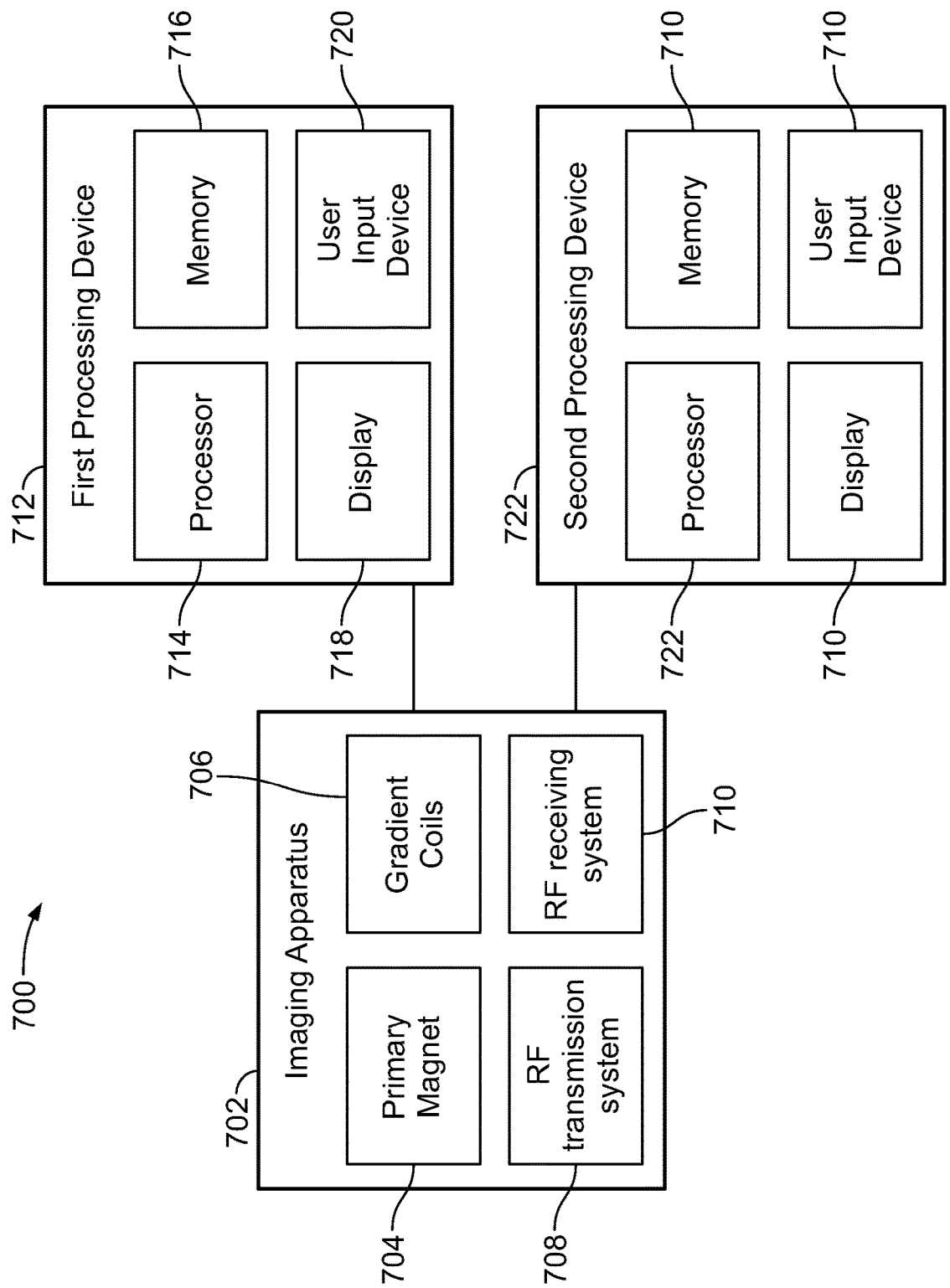
FIG. 7 is a system for determining an exchange rate between a solute material and a solvent material in chemical exchange with each other, according to aspects of the present disclosure.

Aspects of the present disclosure can be implemented using a variety of hardware. One such implementation is illustrated in FIG. 7. A system 700 for determining the exchange rate of a solute material in a sample includes an imaging apparatus 702, a first processing device 712, and a second processing device 722. The imaging apparatus 702 can be one used for standard magnetic resonance imaging, and can include a primary magnet 704, gradient coils 706, an RF transmission system 708, and an RF receiving system 710. The primary magnet 704 can be a permanent magnet, an electromagnet (such as a coil), or any other suitable magnet. Primary magnet 704 is used to create the external magnet field that is applied to the sample during imaging. Gradient coils 706 create a secondary magnet field that distorts the external magnetic field and can cause the resonance frequency of the protons in the sample to vary by position. The gradient coils 706 can thus be used to spatially encode the positions of protons throughout the sample, e.g. can be used to select which plane intersecting the sample will be used for imaging. The RF transmission system 708 is used to apply the RF pulse sequence that provides energy to the protons in the sample to rotate their magnet moments out of alignment with the external magnetic field, and saturates the solute material protons. The RF transmission system 708 generally includes a frequency generator (such as an RF synthesizer), a power amplifier, and a transmitting coil. The RF receiving system 710 receives the signals emitted by the protons in the sample as they relax back to their standard alignment. The RF receiving system 710 can a receiving coil to receive the emitted signals, and a pre-amplifier for boosting the received signals and ensuring the signals are suitable for processing. In some implementations, the RF receiving system 710 can include a signal processing component that processes the received signals to provide data that is usable by the first processing device 712 and/or the second processing device 720. Each of the component of the imaging apparatus can be disposed within one or more housings.

The first processing device 712 can be communicatively coupled to the imaging apparatus 702, and can include a processor 714, processor-executable memory 716, a display 718, and a user input device 720. The first processing device 712 is used to manage the operations of the imaging apparatus 702, and can thus be configured to cause the imaging apparatus 702 to perform the CEST scans on the sample and receive any resulting data from the signal processing component. The second processing device 722 is similar to the first processing device 712, and can include a processor 724, a processor-executable memory 726, a display 728, and a user input device 730. The second processing device 720 can be used to receive and analyze the data resulting from the CEST scans performed on the sample to determine the reference and label data signals, simulate CEST scans performed on the sample to obtain the reference dictionary signal and the plurality of label dictionary signals, process the data and dictionary signals to correct for the MT effect and determine the exchange rate of the solute material in the sample.

In other implementations, processing devices 712 and 720 can be used to perform various aspects of the methods disclosed herein in a different arrangement than that described with respect to FIG. 7. For example, the first processing device 712 may be used to create the acquisition index, perform the CEST scans according to the acquisition index, process the received signals to produce data indicative of the performed CEST scans, analyze the data to determine the reference and label data signals, and transmit the reference and label data signals to the second processing device 720. In other implementations, the second processing device 720 can be used to create the acquisition index and transmit the acquisition index to the first processing device 712 to be used in performing the CEST scans on the sample.

In the example implementation of FIG. 7, system 700 utilized separate processing devices to control the imaging apparatus 702 and to analyze the data. In other implementations, a single processing device may be used to control the imaging apparatus 702, process the signals received from the RF receiving system, determine the data signals, simulate CEST scans to determine the dictionary signals, correct for the MT effect, and analyze final data and dictionary signals to determine the exchange. In still other implementations, a variety of different processing devices can be used to perform various aspects of the methods disclosed herein. Those of skill in the art will understand that any number of processing devices can be used to perform various aspects of the methods disclosed herein.

Aspects of the present disclosure can be implemented on a variety of types of processing devices, such as general purpose computer systems, microprocessors, digital signal processors, micro-controllers, application specific integrated circuits (ASICs), programmable logic devices (PLDs) field programmable logic devices (FPLDs), programmable gate arrays (PGAs), field programmable gate arrays (FPGAs), mobile devices such as mobile telephones, personal digital assistants (PDAs), or tablet computers, local servers, remote servers, wearable computers, or the like.

Memory storage devices of the one or more processing devices can include a machine-readable medium on which is stored one or more sets of instructions (e.g., software) embodying any one or more of the methodologies or functions described herein. The instructions can further be transmitted or received over a network via a network transmitter receiver. While the machine-readable medium can be a single medium, the term "machine-readable medium" should be taken to include a single medium or multiple media (e.g., a centralized or distributed database, and/or associated caches and servers) that store the one or more sets of instructions. The term "machine-readable medium" can also be taken to include any medium that is capable of storing, encoding, or carrying a set of instructions for execution by the machine and that cause the machine to perform any one or more of the methodologies of the various embodiments, or that is capable of storing, encoding, or carrying data structures utilized by or associated with such a set of instructions. The term "machine-readable medium" can accordingly be taken to include, but not be limited to, solid-state memories, optical media, and magnetic media. A variety of different types of memory storage devices, such as a random access memory (RAM) or a read only memory (ROM) in the system or a floppy disk, hard disk, CD ROM, DVD ROM, flash, or other computer readable medium that is read from and/or written to by a magnetic, optical, or other reading and/or writing system that is coupled to the processing device, can be used for the memory or memories.

While aspects of the present disclosure have been described with reference to one or more particular implementations, those skilled in the art will recognize that many changes may be made thereto without departing from the spirit and scope of the present disclosure. Each of these implementations and obvious variations thereof are contemplated as falling within the spirit and scope of the present disclosure. It is also contemplated that additional implementations according to aspects of the present disclosure may combine any number of features from any of the implementations described herein.

What is claimed is:

1. A method of determining an exchange rate between a solute material and a solvent material in chemical exchange with each other in a sample, the method comprising:
   receiving data indicative of a plurality of reference CEST scans performed on the sample and a plurality of label CEST scans performed on the sample;
   determining a reference data signal and a label data signal based on the received data;
   simulating a plurality of reference CEST scans on the sample to obtain a reference dictionary signal;
   simulating a plurality of groups of label CEST scans on the sample to obtain a plurality of label dictionary signals, each of the plurality of label dictionary signals corresponding to a respective one of a plurality of candidate exchange rates between the solvent material and the solute material;
   correcting the reference dictionary signal and each of the plurality of label dictionary signals for a magnetization transfer effect between the solvent material and the solute material;
   determining a final data signal based on the reference data signal and the label data signal;
   determining a plurality of final dictionary signals based on the reference dictionary signal and the plurality of label dictionary signals; and
   determining the exchange rate between the solute material and the solvent material in the sample by matching the final data signal to one of the plurality of final dictionary signals.

2. The method of claim 1, further comprising creating an acquisition index containing a plurality of entries n, each of the n entries of the acquisition index specifying a respective saturation power and a respective saturation time.

3. The method of claim 2, wherein an nth one of the plurality of performed reference CEST scans and an nth one of the plurality of simulated reference CEST scans each correspond to the nth one of the plurality of entries in the acquisition index such that the nth one of the plurality of performed reference CEST scans is performed at the saturation power and the saturation time specified by the nth one of the plurality of entries in the acquisition index and the nth one of the plurality of simulated reference CEST scans is simulated at the saturation power and the saturation time specified by the nth one of the plurality of entries in the acquisition index.

4. The method of claim 3, wherein the reference data signal and the reference dictionary signal each contain n data points, the nth data point of the reference dictionary signal being a simulation of the nth data point of the reference data signal.

5. The method of claim 2, wherein an nth one of the plurality of performed label CEST scans and an nth one of the plurality of simulated label CEST scans of each of the plurality of groups of simulated label CEST scans each correspond to the nth one of the plurality of entries in the acquisition index such that the nth one of the plurality of performed label CEST scans is performed at the saturation power and the saturation time specified by the nth one of the plurality of entries in the acquisition index and the nth one of the plurality of simulated label CEST scans of each of the plurality of groups of simulated label CEST scans is simulated at the saturation power and the saturation time specified by the nth one of the plurality of entries in the acquisition index.

6. The method of claim 5, wherein the label data signal and each of the plurality of label dictionary signals each contain n data points, the nth data point of each of the plurality of label dictionary signals being a simulation of the nth data point of the label data signal at the respective one of the plurality of candidate exchange rates between the solute material and the solvent material.

7. The method of claim 2, wherein the saturation power of each of the n entries in the acquisition index is between about 0.0 µT and about 2.0 µT.

8. The method of claim 2, wherein the saturation time of each of the n entries in the acquisition index is between about 0.0 seconds and about 1.5 seconds.

9. The method of claim 2, wherein the saturation power and the saturation time of each of the n entries are selected on a pseudorandom basis.

10. The method of claim 1, wherein each of the plurality of performed reference CEST scans is performed at a saturation frequency offset of about −2.0 ppm, and wherein each of the plurality of performed label CEST scans is performed at a saturation frequency offset of about 2.0 ppm.

11. The method of claim 1, wherein each of the plurality of simulated reference CEST scans is simulated at a saturation frequency offset of about −2.0 ppm, and wherein each of the plurality of simulated label CEST scans is performed at a saturation frequency offset of about 2.0 ppm.

12. The method of claim 1, wherein each of the plurality of performed reference CEST scans is performed at one of a plurality of saturation frequency offsets to obtain a plurality of partial reference data signals, wherein the plurality of partial reference data signals are interpolated to obtain the reference data signal.

13. The method of claim 1, further comprising:
  normalizing the reference data signal and the label data signal to the reference data signal; and
  normalizing the reference dictionary signal and each of the plurality of label dictionary signals to the reference dictionary signal.

14. The method of claim 1, wherein correcting the reference dictionary signal and each of the plurality of label dictionary signals for the magnetization transfer effect comprises:
  comparing the reference data signal and the reference dictionary signal to obtain a magnetization transfer signal;
  subtracting the magnetization transfer signal from the reference dictionary signal; and
  subtracting the magnetization transfer signal from each of the plurality of label dictionary signals.

15. The method of claim 1, wherein the final data signal is determined by subtracting the label data signal from reference data signal.

16. The method of claim 1, wherein each of final dictionary signals are determined by subtracting each of label dictionary signals from the reference dictionary signal.

17. The method of claim 1, wherein the determining the exchange rate between the solute material and the solvent material comprises:
  determining a value of a vector dot product between the final data signal and each of the plurality of final dictionary signals; and
  selecting the one of the plurality of final dictionary signals having the largest value of the vector dot product.

18. The method of claim 1, further comprising:
  defining a cross-sectional area of the sample, the cross-sectional area containing a plurality of pixels;
  determining the exchange rate between the solute material and the solvent material for each of the plurality of pixels; and
  mapping the exchange rate of the solute material to the cross-sectional area by correlating the exchange rate at each of the plurality of pixels to a color of each of the plurality of pixels.

19. The method of claim 18, wherein each of the plurality of performed reference and label CEST scans is performed at a pseudorandom saturation power and a pseudorandom saturation time, and wherein each of the plurality of simulated reference and label CEST scans is simulated at a pseudorandom saturation power and a pseudorandom saturation time.

20. A system for determining an exchange rate between a solute material and a solvent material in chemical exchange with each other in a sample, the system comprising:
  at least one processor; and
  at least one memory containing processor-executable instructions, which when executed by the at least one processor, cause the at least one processor to:
    receive data indicative of a plurality of reference CEST scans performed on the sample and a plurality of label CEST scans performed on the sample;
    determine a reference data signal and a label data signal based on the received data;
    simulate a plurality of reference CEST scans on the sample to obtain a reference dictionary signal;
    simulate a plurality of groups of label CEST scans on the sample to obtain a plurality of label dictionary signals, each of the plurality of label dictionary signals corresponding to a respective one of a plurality of candidate exchange rates between the solute material and the solvent material;
    correct the reference dictionary signal and each of the plurality of label dictionary signals for a magnetization transfer effect between the solute material and the solvent material;
    determine a final data signal based on the reference data signal and the label data signal;
    determine a plurality of final dictionary signals based on the reference dictionary signal and the plurality of label dictionary signals; and
    determine the exchange rate between the solute material and the solvent material in the sample by matching the final data signal to one of the plurality of final dictionary signals.

\* \* \* \* \*